United States Patent [19]

Harris

[11] Patent Number: 5,698,472
[45] Date of Patent: Dec. 16, 1997

[54] METHOD AND A DEVICE FOR OXIDATION OF A SEMICONDUCTOR LAYER OF SIC

[75] Inventor: Christopher Harris, Sollentuna, Sweden

[73] Assignee: ABB Research Ltd., Zurich, Switzerland

[21] Appl. No.: 612,484

[22] Filed: Mar. 7, 1996

[51] Int. Cl.$^6$ .................................................. H01L 21/02
[52] U.S. Cl. ........................ 437/239; 437/100; 437/173; 437/244; 437/DIG. 148
[58] Field of Search ........................ 437/239, 247, 437/100, 244, 19, 173; 148/DIG. 115, DIG. 148

[56] References Cited

U.S. PATENT DOCUMENTS

| | | |
|---|---|---|
| 4,474,829 | 10/1984 | Peters .................................... 437/244 |
| 5,028,560 | 7/1991 | Tsukamoto et al. . |
| 5,178,682 | 1/1993 | Tsukamoto et al. . |
| 5,443,863 | 8/1995 | Neely et al. ............................ 437/239 |

FOREIGN PATENT DOCUMENTS

| | | |
|---|---|---|
| 0 661 110 | 5/1995 | European Pat. Off. . |
| 62008519 | 1/1987 | Japan . |
| 0174925 | 7/1987 | Japan . |

OTHER PUBLICATIONS

Allen et al., "Vacuum ultraviolet substrate cloning and etching", Solid State Tech., May 1995, pp. 77–80.

Primary Examiner—Tuan H. Nguyen
Attorney, Agent, or Firm—Pollock, Vande Sande & Priddy

[57] ABSTRACT

The present invention is directed to a method and device for oxidation of a semiconductor layer of SiC at the surface thereof for forming an insulating surface layer of $SiO_2$, in which the semiconductor layer is heated and oxygen is fed to the surface of the semiconductor layer for diffusing thereinto and reacting with the SiC in the surface layer while oxidating it to form $SiO_2$ and C-oxides that diffuse out of the semiconductor layer, wherein the surface of the semiconductor layer is illuminated by vacuum ultraviolet light during at least a phase of the oxidation to improve the quality of the $SiO_2$ layer formed.

18 Claims, 1 Drawing Sheet

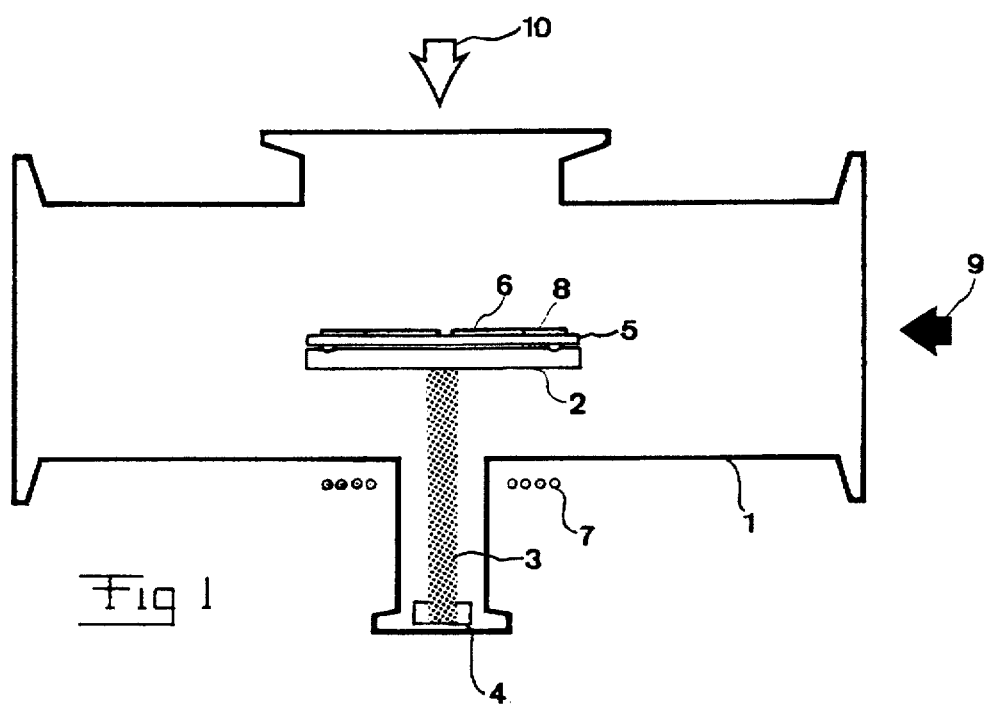
Fig 1
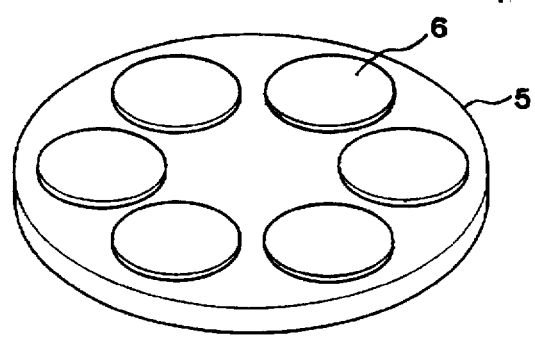
Fig 2
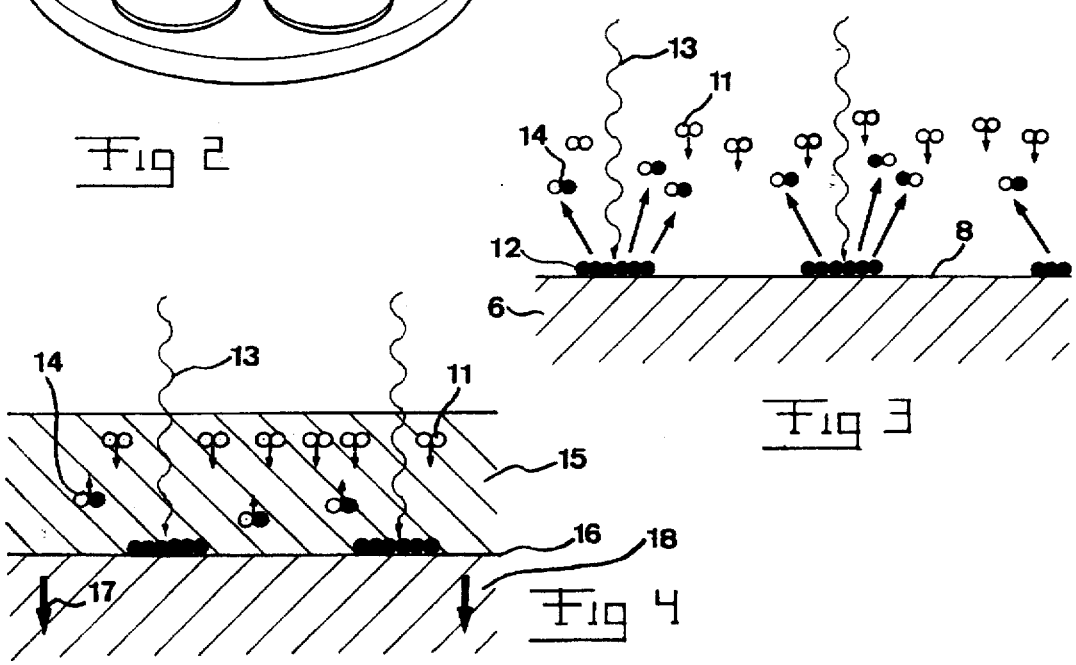
Fig 3
Fig 4

METHOD AND A DEVICE FOR OXIDATION OF A SEMICONDUCTOR LAYER OF SIC

TECHNICAL FIELD

The present invention relates to a method for oxidation of a semiconductor layer of SiC at the surface thereof for forming an insulating surface layer of $SiO_2$. The semiconductor layer is heated and oxygen is fed to the surface of the semiconductor layer for diffusing thereinto and reacting with the SiC in the surface layer while oxidizing it to form $SiO_2$ and C-oxides that diffuse out of said semiconductor layer. This invention is also related to as a device for carrying out such a method.

Such a method is used to obtain an insulating surface layer of $SiO_2$ on a semiconductor device having a semiconductor layer of SiC. The insulating layer is used primarily for passivation purposes, but it may also be used to obtain for instance a layer insulating the gate from the SiC semiconductor layer in a semiconductor device having an insulated gate. The semiconductor devices may be of any kind, such as for example different types of diodes, transistors and thyristors.

BACKGROUND OF THE INVENTION

Devices having a semiconductor layer of SiC may be much more suited than semiconductor devices of Si for certain applications, where it is possible to benefit from the superior properties of SiC in comparison with especially Si, one of which being a high thermal conductivity, so that SiC devices may be arranged at a high density. However, one of the key issues for the successful development of SiC devices is to obtain an oxidation process leading to a satisfying result, i.e. a high quality $SiO_2$ layer on SiC layer having a uniformity across the layer and an excellent interface between the layers.

For a number of years there have been extensive work on the refinement of thermal oxidation of SiC to produce an insulating surface layer of $SiO_2$ on a semiconductor layer of SiC having the quality required for a semiconductor device. However, the methods used so far have not succeeded in solving the fundamental problem with the interface quality between the $SiO_2$ and the SiC. Recently the source of these defects has been identified as being excess carbon at the interface in the form of clusters. Such carbon-clusters may be present as "dirt" on the surface of the SiC-layer when the oxidation process is started, and carbon will remain at the interface between the SiC and the $SiO_2$ due to insufficient and incomplete oxidation of the carbon during the oxidation of SiC at the interface by the oxygen diffused through the $SiO_2$-layer formed so far to the interface. This may result in a poor interface quality between the $SiO_2$ and the SiC, and there will be more or less column-like structures of carbon raising from the interface and towards the surface of the $SiO_2$-layer. Thus, the critical step in achieving a good quality $SiO_2$-surface layer on a semiconductor layer of SiC is the removal of this carbon. This problem is very specific for SiC because of the presence of carbon as an element in this semiconductor material.

SUMMARY OF THE INVENTION

The object of the present invention is to provide a method and a device making it possible to obtain an oxidation of a semiconductor layer of SiC next to the surface thereof to form an insulating surface layer of $SiO_2$ having a high quality without any disturbing carbon therein, primarily at the interface between the SiC- and $SiO_2$-layers.

This object is obtained by providing a method of the type defined in the introduction with the additional step of illuminating the surface of the semiconductor layer by ultraviolet light during at least a phase of the oxidation as well as by providing a device for performing this method. The illumination of said surface by ultraviolet light results in a high quality oxidation, while at the same time limiting carbon defect formation. The ultraviolet light dissociates the C—C-bonds formed at the interface, allowing efficient oxidation of the carbon to form primarily CO, which may diffuse out of the semiconductor layer through the $SiO_2$-layer formed. In this way the formation of column-like structures of carbon is avoided. Furthermore, an additional advantage of the ultraviolet illumination is that it produces radiation harder $SiO_2$ due to the higher density of the amorphous layer achieved when the oxide layer formed is excerted to such illumination. Such a high quality oxide on SiC will be beneficial to the stability of power devices.

According to a preferred embodiment of the invention the surface of the semiconductor layer is illuminated by ultraviolet light during at least the initial phase of the oxidation. This has turned out to be very advantageous, since if it is succeeded to break the bonds of possible C-clusters present on the surface of the semiconductor layer when the oxidation process is started, the problem of a degraded interface between the $SiO_2$ and the SiC later on may disappear, since there is a lower probability of any C-cluster formation at the interface. Instead the formations of single C—C-bonds and the probability of breaking such bonds just by oxygen arriving is much higher than the probability of breaking C—C-bonds of C-clusters, so that the interface may be of a high quality.

According to another preferred embodiment of the invention the surface of the semiconductor layer is illuminated by ultraviolet light during the whole period of time during which oxygen is fed to the surface and the insulating surface layer of $SiO_2$ is formed. The illumination of the surface during the entire oxidation process will result in an efficient dissociation of C—C-bonds being there from the start and formed during the oxidation process resulting in a high quality oxide on the SiC.

According to another preferred embodiment of the invention the semiconductor layer is heated at a temperature between 1000° C. and 1150° C. during the oxidation process. This temperature has been found to be appropriate for obtaining a high quality oxide on the SiC.

According to another preferred embodiment of the invention the surface is illuminated by ultraviolet light having an energy exceeding 5 eV. The experience has shown that although ultraviolet light having a slightly lower energy breaks the C—C-bonds ultraviolet light having this higher energy will more efficiently break the bonds and produce a radiation hard $SiO_2$-layer.

According to a still further preferred embodiment of the invention the ultraviolet light is a vacuum ultraviolet light, which has turned out to be very efficient in breaking the C—C-bonds.

According to another preferred embodiment of the invention the oxygen is fed to the semiconductor surface substantially parallel thereto, and the semiconductor layer is rotated about an axis substantially perpendicular to the surface during the oxidation. Thanks to this way of supplying the oxygen and the rotation of the semiconductor layer during the oxidation a uniform gas flow over the semiconductor layer will be obtained. This is very essential for achieving a uniformity of the $SiO_2$-layer across the layer, which is an important criteria for the quality of the layer and the interface thereof.

According to still another preferred embodiment of the invention the semiconductor layer is mounted on a susceptor which is heated uniformly over at least the entire extension of the semiconductor layer in the direction of the surface for obtaining a uniform temperature of the semiconductor layer in that direction during the oxidation process. In this way a uniform temperature distribution over the entire extension of the semiconductor layer of SiC is obtained, which is a necessary for obtaining a uniformity of the $SiO_2$-layer produced thereacross for obtaining a high quality of the surface layer and the interface to the SiC-layer. This embodiment in combination with the previous one will of course constitute a very preferred embodiment of the invention.

The advantages discussed above will of course be there for the corresponding characteristics of the different embodiments of the device according to the invention.

BRIEF DESCRIPTION OF THE DRAWING

With reference to the appended drawing, below follows a specific description of a preferred embodiment of the invention cited as an example.

In the drawing:

FIG. 1 is a schematic view of a device for oxidation of a semiconductor layer of SiC according to the invention, FIG. 2 is an enlarged view of a SiC-wafer holder of the device according to FIG. 1, FIG. 3 is a very simplified schematic view illustrating the start of the oxidation process according to the invention's method, and FIG. 4 is also a very simplified and schematic view illustrating how the $SiO_2$ surface layer is produced.

DETAILED DESCRIPTION OF A PREFERRED EMBODIMENT OF THE INVENTION

FIG. 1 illustrates very schematically a device, a so called furnace, for oxidation of a semiconductor layer of SiC at the surface thereby forming an insulating surface layer of $SiO_2$. Only the components thereof being of relevance for the invention have been indicated in the figure. The device comprises a casing 1, inside which preferably a subatmospheric pressure prevails thanks to pumping means not shown. In the casing 1 a susceptor 2, which may also be made of SiC, is arranged. The susceptor 2 is supported by an axle 3 being through the operation of a power means 4 rotatable about the axis thereof. The susceptor 2 is arranged to carry a holder 5 for wafers 6, in the form of semiconductor layers of SiC, and this holder 5 is a plate made of quartz. In such a device a plurality of semiconductor layers of SiC may be oxidized at the same time.

The device does also comprise means 7 for heating the susceptor 2 and by that also the wafers 6 and this means are here constituted by a coil radiating a Rf-field for inductive heating. This coil is schematically indicated as 7. The of the coil 7 in the extension direction of the surfaces 8 of the wafers is so selected that the coil assures a uniform heating of the wafers over at least the entire extension of the wafers irrespective of their position when the susceptor 2 is rotated.

The device also comprises means 9, schematically indicated by an arrow, for feeding oxygen, here $O_2$, to the surface of the wafers 6. The oxygen is fed to the semiconductor surfaces 8 of SiC substantially parallel thereto by means 9. Thanks to this way of supplying the oxygen and the simultaneous rotation of the susceptor with the wafers about an axis substantially perpendicular to the feeding direction of gas flow a uniform gas flow over the surfaces 8 of the wafers and a uniform temperature distribution over the entire wafers 6 is obtained.

The device also comprises an ultraviolet source 10, also schematically indicated by an arrow, arranged to illuminate the surfaces 8 of the semiconductor layers 6 by ultraviolet light during at least a phase of the oxidation process described below. The ultraviolet light may be of any wavelength, but it has been found that a wavelength corresponding to an energy above about 5 eV is preferable. Actually vacuum ultraviolet light (VUV) is used and has turned out to be very advantageous for fulfilling the task described more in detail below. Vacuum ultraviolet light has typically a wavelength of 115–180 nm.

The oxidation of a surface layer of the semiconductor layers 6 of SiC is carried out by heating the semiconductor layers 6 at a temperature above 900° C., preferably between 1000° C. and 1150° C., and at the same time feeding oxygen to the surfaces 8. The oxygen will then due to the high temperature of the SiC layer diffuse thereinto and react with the SiC for forming $SiO_2$ and C-oxides, primarily CO, diffusing out of the semiconductor layer. Alternatively the reaction of $O_2$ with SiC results in $SiO_2$ and C, the free C is able to move to bond to a neighbouring C forming a strong C—C-bond. This process will now be explained with reference to FIGS. 3 and 4.

FIG. 3 to very schematically illustrate the start of the method according to the invention. It is assumed that a SiC-layer 6 is heated to the appropriate temperature and $O_2$-molecules 11 are fed to the surface 8 thereof. Please note that although the $O_2$-molecules are provided with arrows pointing towards the surface 8 they will in practice pass over the surface substantially parallel thereto in a laminar flow. At the beginning of the oxidation there may typically be some excess of C in the surface 8 of the SiC-layer 6, especially in the form of C-clusters 12 schematically indicated in FIG. 3. The oxygen molecules arriving at the surface 8 will react with the SiC of the SiC layer 6 in the most favorable way, i.e. while seeking a state of the lowest totally energy, which means that the bonds between the Si- and C-atoms will be broken and $SiO_2$ as well as C—C-bonds will be formed. This reaction may take place in several steps including SiO as an intermediate product. Although oxygen is present the breaking of these C—C-bonds and the formation of carbon oxides, especially CO, may be a slow reaction in the oxygen clean environment of the interface. Furthermore, the C-clusters 12 on the surface 8 have rather strong bonds and will only with a very low probability be dissociated and react with oxygen coming close thereto. What has been described in the last two sentences is the believed reaction scenario in the absence of UV illumination. The ultraviolet light 13 inciding on the surface 8 dissociate the C—C-bonds of the clusters 12, so that the reaction with oxygen may occur more vigorously and CO-molecules 14 may be formed. Furthermore, the ultraviolet light 13 also assists in the dissociation of C—C-bonds formed due to the reaction of the oxygen with the SiC and by that substantially increase the probability of the oxygen to form carbon monoxide with such carbon atoms, so that the latter may be removed from the wafers 6 by the out-diffusion of the CO therefrom.

It is indicated in FIG. 4 how an insulating surface layer 15 of $SiO_2$ is formed in this way by thermal oxidation. The oxygen molecules 11 will diffuse through the $SiO_2$-layer to the interface 16 between this and the semiconductor layer 18 of SiC, where the reaction with the SiC takes place while forming $SiO_2$ and carbon. In this way the interface 16 moves, as indicated by the arrows 17, deeper into the wafer 6. The ultraviolet light 13 during this "growth" of the SiO$_2$-layer 15 facilitates the dissociation of the C—C-bonds formed at the interface 16 between the two layers 15 and 18. The ultraviolet light also influence the SiO$_2$-layer while penetrating it, so that this will achieve a higher density and by that be radiation harder, which is beneficial to the stability of a power device so formed and may thereby raise the peripheral breakdown voltage thereof.

In this way a high quality final interface between the SiO$_2$-layer without substantially any defects in the form of remaining excess C-atoms or -molecules may be formed. The temperature at which the wafers 6 are heated should be at least so high that the CO-molecules formed by the oxidation of the carbon of SiC may diffuse out of the wafers. Furthermore, the temperature is preferably chosen so that the diffusion of the oxygen into the semiconductor layer is limited and the location of the final interface between the SiO$_2$-layer produced and the SiC-layer next thereto will be at a depth allowing the ultraviolet light to reach the final interface, so that the ultraviolet light may increase the probability of forming CO-molecule in the way described above during the entire oxidation process. However, it is within the scope of the invention to grow even thicker SiO$_2$-layers, since it is mostly more important to illuminate the surface 8 by ultraviolet light during the initial phase of the oxidation for removing C-clusters from the surface 8, and the illumination during the last phase of the oxidation process may sometime be omitted. It is also within the scope of the invention to illuminate the surface of the semiconductor layer by ultraviolet light during only another phase of the oxidation process not coinciding with the start thereof. However, an optimum of quality of the SiO$_2$-layer grown and of the final interface between this and the SiC-layer thereunder, also with respect to the radiation hardness of the SiO$_2$-layer, is obtained when the semiconductor layer is illuminated by ultraviolet light, preferably vacuum ultraviolet light, during the whole oxidation process.

The invention is of course not in any way restricted to the preferred embodiment described above, but many possibilities to modifications thereof would be apparent to a person skilled in the art without departing from the basic idea of the invention.

The definition of "a semiconductor layer of SiC" does of course also include inevitable impurities as well as intentional doping.

The definition of layer is to be interpreted broadly and comprise all types of volume extensions and shapes.

I claim:

1. A method for oxidation of a semiconductor layer of SiC at the surface thereof for forming an insulating surface layer of SiO$_2$, said method comprising the steps of:

heating said semiconductor layer at a temperature above 900° C.;

feeding oxygen to the surface of said semiconductor layer during heating and diffusing oxygen into said layer reacting said oxygen diffused in said layer with the SiC in said surface layer and oxidating said SiC to form SiO$_2$ and C-oxides; said C-oxides diffusing out of said semiconductor layer; and illuminating said surface of said semiconductor layer by vacuum ultraviolet light (VUV) having wavelength of 115 to 180 nanometers during at least a phase of said oxidation, so as to improve the quality of the SiO$_2$ layer formed.

2. A method according to claim 1, wherein said surface of said semiconductor layer is illuminated by vacuum ultraviolet light during at least the initial phase of said oxidation.

3. A method according to claim 1, wherein said surface of said semiconductor layer is illuminated by vacuum ultraviolet light during the whole period of time during which oxygen is fed to the surface and the insulating surface layer of SiO$_2$ is formed.

4. A method according to claim 1, wherein said semiconductor layer is heated at such a temperature that the diffusion of said oxygen into the semiconductor layer is limited and wherein the location of the final interface between the SiO$_2$ layer produced and the SiC-layer next thereto is at a depth allowing said vacuum ultraviolet light to reach said final interface.

5. A method according to claim 1, wherein said semiconductor layer is heated at a temperature between 1000° C. and 1150° C. during the oxidation process.

6. A method according to claim 1, wherein said surface is illuminated by vacuum ultraviolet light having an energy exceeding 5 eV.

7. A method according to claim 1, wherein said oxygen is fed to said semiconductor surface substantially parallel thereto, and wherein said semiconductor layer is rotated about an axis substantially perpendicular to said surface during the oxidation.

8. A method according to claim 1, wherein the vacuum ultraviolet light is directed substantially perpendicularly to said semiconductor surface.

9. A method according to claim 1, wherein said semiconductor layer is received by a susceptor which is heated uniformly over at least the entire extension of said semiconductor layer in the extension direction of said surface for obtaining a uniform temperature of said semiconductor layer in that direction during the oxidation process.

10. A device for oxidation of a semiconductor layer of SiC next to the surface of a semiconductor for forming an insulating surface layer of SiO$_2$, said device comprising:

means for heating said semiconductor layer at a temperature above 900° C.;

means for feeding oxygen to the surface of said semiconductor layer during heating and for diffusing oxygen into said layer so as to react said oxygen diffused in said layer with the SiC in said surface layer and oxidate said SiC to SiO$_2$ and C-oxides; said C-oxides diffusing out of said semiconductor layer; and a vacuum ultraviolet light source arranged to illuminate said surface of said semiconductor layer by vacuum ultraviolet light having wavelength of 115 to 180 nanometers during at least a phase of said oxidation.

11. A device according to claim 10, wherein said ultraviolet source is arranged to illuminate said surface of said semiconductor layer by ultraviolet light during at least the initial phase of said oxidation.

12. A device according to claim 10, wherein said ultraviolet source illuminates said surface of said semiconductor layer by ultraviolet light during the whole period of time during which oxygen is fed to the surface and the insulating surface layer of SiO$_2$ is formed.

13. A device according to claim 10, wherein said heating means heats said semiconductor layer at such a temperature that the diffusion of said oxygen into the semiconductor layer is limited and wherein the location of the final interface between the SiO$_2$ layer produced and the SiC-layer next thereto is at a depth allowing said ultraviolet light to reach said final interface.

14. A device according to claim 10, wherein said heating means heats said semiconductor layer at a temperature between 1000° C. and 1150° C. during the oxidation process.

15. A device according to claim 10, wherein said ultraviolet light source illuminates said surface by vacuum ultraviolet light having an energy exceeding 5 eV.

16. A device according to claim 10, wherein said oxygen feeding means feeds oxygen to said semiconductor surface substantially parallel thereto, and wherein the device further comprises means for rotating said semiconductor layer about an axis substantially perpendicular to said surface during the oxidation.

17. A device according to claim 10, wherein said ultraviolet light source directs the ultraviolet light emitted therefrom substantially perpendicularly to said semiconductor surface.

18. A device according to claim 10, wherein it comprises a susceptor adapted to receive at least one said semiconductor layer of SiC, said heating means heats said semiconductor layer by heating said susceptor, and the heating means heats said susceptor uniformly over at least the entire extension of said semiconductor layer in the extension direction of said surface for obtaining a uniform temperature of said semiconductor layer in that direction during the oxidation process.

* * * * *